United States Patent [19]
Creasi, Jr.

[11] Patent Number: 5,882,719
[45] Date of Patent: Mar. 16, 1999

[54] SOLID TANTALUM CAPACITOR TEST

[75] Inventor: Richard M. Creasi, Jr., Bellingham, Mass.

[73] Assignee: H. C. Starck, Inc., Newton, Mass.

[21] Appl. No.: 764,162

[22] Filed: Dec. 13, 1996

Related U.S. Application Data

[60] Provisional application No. 60/008,573, Dec. 13, 1995.

[51] Int. Cl. [6] ........................................ B05D 5/12
[52] U.S. Cl. .............................. 427/8; 427/79; 427/126.3; 29/25.03; 205/775; 205/790.5; 205/791.5; 324/658; 361/523; 361/529; 361/532
[58] Field of Search .................................. 427/79, 80, 81, 427/123, 126.3, 436, 8; 205/775, 790.5, 791.5; 325/519, 522; 361/523, 525, 528, 529, 532; 29/25.03; 324/658

[56] References Cited

U.S. PATENT DOCUMENTS

| | | | |
|---|---|---|---|
| 3,818,581 | 6/1974 | Vartanian et al. | 29/570 |
| 3,976,435 | 8/1976 | Klein | 29/192 R |
| 4,218,649 | 8/1980 | Kutzavitch | 324/54 |
| 4,544,403 | 10/1985 | Schiele et al. | 75/0.5 AB |
| 4,724,021 | 2/1988 | Martin et al. | 156/89 |

*Primary Examiner*—Brian K. Talbot
*Attorney, Agent, or Firm*—Jerry Cohen

[57] ABSTRACT

A combination of static voltage and sweep voltage tests performed on capacitor grade powders gives a valid prediction of performance of eventual solid electrolyte capacitors incorporating such powders.

2 Claims, No Drawings

SOLID TANTALUM CAPACITOR TEST

CROSS REFERENCE TO RELATED APPLICATIONS

This application claims priority of provisional application number 60/008,573, filed Dec. 13, 1995.

BACKGROUND OF THE INVENTION

The present invention relates to production of high performance solid electrolyte capacitors and affords a quality control method to enhance reliability of testing to thereby increase quality of end products and reduce production costs compared to state-of-the-art.

The well known processing of solid electrolyte capacitors involves production of powders from tantalum (substitutable in some cases by like reactive metals, e.g., titanium, niobium, tantalum-niobium alloys) of certain capacitance, voltage breakdown (VBD) and leakage values. The powders are made into porous anode blocks by powder metallurgy techniques; anodic oxide is "formed" on exposed powder surfaces within the porous anode mass by wet electrochemistry methods; the formed anodes are tested for capacitance, VBD and leakage in a wet electrochemical capacitor simulating arrangement; the anodes are further processed by impregnation with a liquid form solid electrolyte precursor and hardening the precursor to a solid form (typically by pyrolysis); followed by applying a counter-electrode (cathode); packaging; and preliminary testing and life testing, on a sample basis, of the finished capacitors. The impregnation and pyrolysis process is applied as a number of subdivided steps of impregnation and pyrolysis. During the course of these steps, it may be necessary to reform the anodic oxide.

It has been long known that the process of introducing a solid electrolyte into the formed anode can be somewhat destructive to the anodic oxide film. That is why the anodes are periodically reformed during the solid capacitor process as a means of repair of such damage. Ultimately, the damage to the oxide film is quite extensive despite the periodic repairs. That is why solid capacitors must be derated by some 67–75%, i.e. rated at 25–33% of their formation voltage (i.e. voltage rating at 25–33% of formation voltage) vs. 50–70% net rating in wet electrolyte capacitors.

It is a principal object of the present invention to provide a test process that provides a reliable indicator of eventual VBD and leakage performance in advance of life testing to identify anodes especially degraded in the course of impregnation-pyrolysis and avoid final processing and life test of these while processing and life testing anodes which are likely to perform well in eventual life testing and ultimate usage.

SUMMARY OF THE INVENTION

I have developed two tests which measure the damage incurred at the anodic film in the capacitor due to incorporation of solid electrolyte into the porous anode structure. One is a rudimentary pass/fail type of test based on static-voltage testing which may predict accelerated life test yield. The second is a qualitative test based on sweep-voltage testing in which the DC leakage current is measured at rated voltage, after which the test voltage is slowly increased in order to ascertain what voltage the units will ultimately fail. These tests are believed to be very useful in determining the overall solid capacitor performance. They can be used together with synergy.

DESCRIPTION OF PREFERRED EMBODIMENTS

The two tests of the present invention are implemented as follows:

Static-Voltage Test:

Pellets of porous tantalum are formed to anodes (electrochemically anodized) in a customary fashion (see below). For example, a typical evaluation of 20 volt-rated units would require an 80-volt formation at 80° C. using 100 mA per gram with a two hour hold at the 80 volt voltage level. The formed anodes are washed and dried after formation. Then the anodes undergo two or three dip-pyrolyis impregnation cycles (depending on pellet size and/or density). A dip-pyrolysis cycle consists of an immersion of the anodes in a somewhat concentrated manganous nitrate (36–44%) solution until the solution is fully absorbed by the anodes. Then they are placed in a pyrolysis oven (250°–300° C.) until the manganous nitrate is fully decomposed (5–10 minutes) into: (a) manganese dioxide (the solid electrolyte) which remains in the pellet and (b) nitric oxides that disperse into the oven and must be properly vented away.

Once the anodes are impregnated with solid electrolyte, they are then tested for D.C. leakage current in an electrolyte of concentrated phosphoric acid (50–85%) at approximately twice the voltage rating (testing at several voltages comparing a known poor powder with a "standard" powder will determine the optimum test voltage) for two to five minutes. The quick charging of the anodes at the "threshold" voltage will induce catastrophic failures in poorer units while the better units survive the test. If capacitance measurements are desired, they should be made before the leakage test. Also, the cathode should have sufficient "surface area" to obtain accurate readings (several unformed sintered pellets attached to the cathode will usually suffice).

Sweep-Voltage Test:

Pellets are formed to anodes in a customary fashion (see below). The formed anodes are washed and dried after formation. Then the anodes undergo two or three dip-pyrolyis impregnation cycles. Once the anodes are impregnated with solid electrolyte, they are then tested for D.C. leakage current in an electrolyte of concentrated phosphoric acid (5–85%) at the rated voltage (25–33% of the formation voltage) for two to five minutes. After the leakage measurement the test voltage is gradually increased at a prescribed rate (1–2 volts/minute) while the leakage current of each anode is monitored. When a unit exhibits evidence of "break down", (a sudden, dramatic increase in leakage current), the voltage at which that this occurs is noted and the unit is taken out of the circuit (so that its excessive current draw does not affect the remaining anodes). The test continues until all of the anodes have "broken down." The maximum voltage that an anode can achieve is dependent on the formation voltage. In the event the anode reaches the same voltage potential as the formation voltage (that voltage will be somewhat higher than the actual formation voltage because the test is being done at room temperature rather than the elevated temperature (usually 80° C.) of the formation), the anode does not "break down" but actually begins to form (this also is observed as a sudden, dramatic increase in current). Theoretically, if there is no damage to the anodic film in any of the anodes, every anode should reach this voltage. Practically, one or two anodes might do so in an exceptionally good powder. Nonetheless, how close the average breakdown voltage comes to this theoretical maximum is an indication of the potential of the powder to survive accelerated life testing. Along with the leakage measurement, this gives an indication of powder quality.

If capacitance values are desired, the measurement should be done before the test, because an anode that has "broken down", might be damaged so that its actual capacitance may be altered.

Table 1 below compares finished solid capacitor performance per life testing with the two types of tests described above as applied to seven different types of tantalum powders as sintered into porous anodes and formed and dip-pyrolyzed as described above. The "static voltage" test successfully predicts the occurrence of life test failures in the poorer performing powders. The "sweep voltage" test also predicts these failures (via low VBD) while also indicating the good solid capacitor performance before life test. Therefore, the "static voltage, test is useful as a simple screening tool to distinguish poor powders from good powders, while the "sweep voltage" test is more of a diagnostic test to determine the particular failure mode of a powder.

In each case the first column is leakage in nano-amperes per microfarad-Volt (cV) and the second column is percentage failure. The second column if the sweep voltage test results is the voltage at which the failure (sharply rising xcueewnt) occurs. The leakages of the sweep voltage test are lower than for the static voltage test.

It can be seen that the static and sweep voltage tests indicate a good outlook for powder samples 1, 2, 3, 4, 6, 7, 8, 9, 10, 11, 12, 13, 14, 20, 25, 26, 27, 28, 29, 30, 31, 32, 33, and 34; and this is backed up by life test results. Conversely, samples 5, 15, 16, 17, 18, 19, 21, 22, 23, and 24 are shown to be poorer performing powders, and that conclusion is also verified by life test results.

This example test was at a voltage rating of 20 volts. Further testing suggests that as the voltage rating decreases, the static voltage test is a more reliable indicator of solid capacitor performance.

TABLE 1

| Sample | Life Test % failures | Static Test DCL geometric mean ($\mu$A) | Sweep Test VBD mean (volts) |
|---|---|---|---|
| 1 | 0.00% | 1.28 | 69.80 |
| 2 | 5.00% | 1.73 | 69.00 |
| 3 | 0.00% | 1.56 | 63.10 |
| 4 | 0.00% | 2.05 | 65.40 |
| 5 | 20.00% | 6.18 | 61.60 |
| 6 | 0.00% | 1.78 | 74.00 |
| 7 | 0.00% | 1.30 | 73.00 |
| 8 | 5.00% | 1.30 | 71.20 |
| 9 | 5.00% | 1.21 | 75.50 |
| 10 | 5.00% | 0.78 | 74.30 |
| 11 | 10.00% | 2.06 | 68.90 |
| 12 | 0.00% | 0.94 | 69.20 |
| 13 | 0.00% | 1.74 | 76.60 |
| 14 | 5.00% | 1.91 | 74.30 |
| 15 | 40.00% | 12.41 | 54.80 |
| 16 | 50.00% | 53.97 | 45.30 |
| 17 | 60.00% | 41.07 | 39.00 |
| 18 | 40.00% | 31.66 | 51.00 |
| 19 | 40.00% | 5.08 | 51.40 |
| 20 | 5.00% | 2.43 | 59.50 |
| 21 | 20.00% | 4.42 | 54.40 |
| 22 | 30.00% | 10.27 | 57.70 |
| 23 | 30.00% | 11.40 | 52.20 |
| 24 | 25.00% | 5.82 | 61.10 |
| 25 | 5.00% | 2.76 | 73.10 |
| 26 | 0.00% | 1.36 | 77.10 |
| 27 | 0.00% | 1.62 | 72.90 |
| 28 | 0.00% | 2.39 | 74.20 |
| 29 | 5.00% | 2.32 | 72.10 |
| 30 | 0.00% | 2.38 | 73.90 |
| 31 | 5.00% | 3.73 | 71.50 |
| 32 | 5.00% | 3.35 | 69.80 |
| 33 | 0.00% | 3.25 | 73.30 |
| 34 | 0.00% | 1.22 | 77.10 |

It will now be apparent to those skilled in the art that other embodiments, improvements, details, and uses can be made consistent with the letter and spirit of the foregoing disclosure and within the scope of this patent, which is limited only by the following claims, construed in accordance with the patent law, including the doctrine of equivalents.

What is claimed is:

1. Process for in-process-of-manufacture quality control of solid electrolyte tantalum capacitors comprising the steps of:

(a) providing formed porous anodes made of compacted tantalum powder and wet electrolytically forming a surface oxidized within the porous anode at a formation voltage and partially impregnated with solid electrolyte within the porous anode prior to complete capacitor fabrication;

(b) wet testing the anodes in a static voltage test to determine powder quality by applying a fixed voltage level at a level in excess of about ¼th of formation voltage to samples of the anodes with solid electrolyte therein via a wet electrolyte;

(c) applying a sweep voltage test, to the partially impregnated porous anodes to determine likely breakdown mode of capacitors eventually formed therefrom, such test comprising advancing a voltage applied to the anodes in increments to establish voltage breakdown, (d) removal of likely failure capacitors on the basis of the tests of steps (b), (c), and (e) proceeding to fabrication including completion of solid electrolyte impregnation and extended life testing with the remaining retained capacitors, the basis of removal or retention, wherein retention is determined when samples reach substantially close to breakdown voltage in the first static voltage test and a high voltage breakdown in the sweep voltage test.

2. Test process as in claim 1 wherein the static test voltage at twice the voltage rating for leakage failure.

* * * * *